(12) United States Patent
    Park

(10) Patent No.: US 9,336,905 B2
(45) Date of Patent: May 10, 2016

(54) REPAIR CIRCUIT AND SEMICONDUCTOR APPARATUS USING THE SAME

(71) Applicant: SK hynix Inc., Icheon-si Gyeonggi-do (KR)

(72) Inventor: Ga Ram Park, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/599,906

(22) Filed: Jan. 19, 2015

(65) Prior Publication Data

US 2016/0099079 A1     Apr. 7, 2016

(30) Foreign Application Priority Data

Oct. 7, 2014    (KR) .......................... 10-2014-0134970

(51) Int. Cl.
    *G11C 29/04* (2006.01)
    *G11C 29/00* (2006.01)
    *G11C 17/16* (2006.01)
    *G11C 17/18* (2006.01)

(52) U.S. Cl.
    CPC ............... *G11C 29/78* (2013.01); *G11C 17/16* (2013.01); *G11C 17/18* (2013.01); *G11C 29/844* (2013.01)

(58) Field of Classification Search
    CPC ........................ G11C 29/844; G11C 29/848
    USPC .......................... 365/96, 200, 230.03, 230.08
    See application file for complete search history.

(56) References Cited

U.S. PATENT DOCUMENTS

| | | | | |
|---|---|---|---|---|
| 5,991,211 A * | 11/1999 | Kato | ....................... | G11C 29/84 365/200 |
| 6,388,941 B2 * | 5/2002 | Otori | ....................... | G11C 5/025 365/185.09 |
| 7,085,181 B2 * | 8/2006 | Otsuka | ................... | G11C 17/16 365/200 |
| 2002/0181303 A1 * | 12/2002 | Kato | .................... | G11C 29/808 365/200 |
| 2005/0276130 A1 * | 12/2005 | Lakhani | .............. | G06F 12/0246 365/200 |
| 2011/0158013 A1 * | 6/2011 | Kim | ....................... | G11C 17/16 365/200 |
| 2014/0177313 A1 * | 6/2014 | Lee | .......................... | G11C 8/10 365/96 |

FOREIGN PATENT DOCUMENTS

| KR | 100618830 B1 | 8/2006 |
|---|---|---|
| KR | 1020140059684 A | 5/2014 |

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A repair circuit includes a fuse set latch array including a plurality of fuse set latches, and configured to store fuse informations in target fuse latches selected among the plurality of fuse set latches in response to fuse latch select signals; a fuse information control unit configured to generate the fuse latch select signals by using boot-up source signals generated by differently combining boot-up mode region select informations according to a region determination signal; and a repair processing unit configured to compare an address inputted from an exterior and the fuse informations, and access a normal memory cell corresponding to the external address or a redundant memory cell.

20 Claims, 8 Drawing Sheets

REPAIR CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2014-0134970, filed on Oct. 7, 2014, in the Korean Intellectual Property Office, which is incorporated herein by reference in its entirety.

BACKGROUND

1. Technical Field

Various embodiments generally relate to a semiconductor circuit, and more particularly, to a repair circuit and a semiconductor apparatus using the same.

2. Related Art

A semiconductor device may detect a cell in which a fail has occurred (hereinafter, referred to as a "failed cell"), through a test.

In the operation of a semiconductor circuit, in the case where an address provided from an exterior is an address for accessing a failed cell, an access is made not to the failed cell but to a redundant memory cell (hereinafter, referred to as a "redundant cell") allocated to the failed cell, which may be referred to as a repair operation.

An address information for accessing a failed cell may be referred to as a failed address information.

The failed address information may be stored in a fuse set.

A circuit design for processing a fuse information, that is, a failed address information stored in a fuse set, to be used in a repair operation, and a time required to process the failed address information may serve as important factors that influences the operational performance of a semiconductor apparatus.

SUMMARY

In an embodiment, a repair circuit may include a fuse set latch array including a plurality of fuse set latches, and configured to store fuse informations in target fuse latches selected among the plurality of fuse set latches in response to fuse latch select signals. The repair circuit may also include a fuse information control unit configured to generate the fuse latch select signals by using boot-up source signals generated by differently combining boot-up mode region select informations according to a region determination signal. The repair circuit may also include a repair processing unit configured to compare an address inputted from an exterior and the fuse informations, and access a normal memory cell corresponding to the external address or a redundant memory cell.

In an embodiment, a semiconductor apparatus may include a fuse set array configured to output fuse informations in a boot-up mode. The semiconductor apparatus may also include a plurality of memory blocks each including a fuse set latch array configured to store the fuse informations in response to fuse latch select signals. The semiconductor memory apparatus may also include a repair circuit configured to generate the fuse latch select signals by using boot-up source signals generated by differently combining boot-up mode region select informations according to a region determination signal. The repair circuit may also be configured to compare addresses inputted from an exterior and the fuse informations, and access normal memory cells of the plurality of memory blocks corresponding to the external addresses or redundant memory cells.

DETAILED DESCRIPTION

Hereinafter, a repair circuit and a semiconductor apparatus using the same will be described below with reference to the accompanying drawings through various embodiments. Various embodiments are directed to a repair circuit capable of efficiently processing a repair operation and a semiconductor apparatus using the same.

Figure 1:
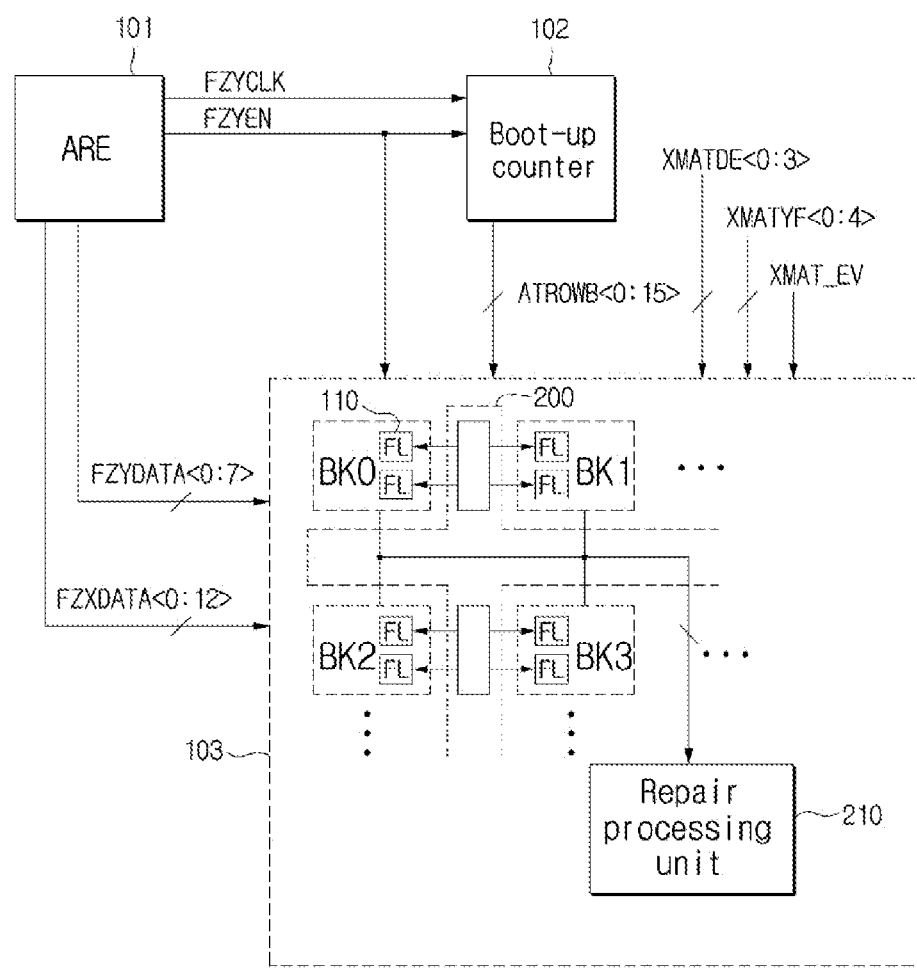
FIG. 1 is a diagram illustrating a representation of an example of the configuration of a semiconductor apparatus in accordance with an embodiment.

Referring to FIG. 1, a semiconductor apparatus 100 in accordance with an embodiment may include a fuse set array 101, a boot-up counter 102, and a core block 103.

The fuse set array 101 includes a plurality of fuse sets. Further, an array E-fuse set (ARE) may be used as a fuse set.

The fuse set array 101 may be configured to output a fuse read clock signal FZYCLK, a boot-up mode activation signal FZYEN, and fuse informations FZYDATA<0:7> and FZXDATA<0:12> in a boot-up mode.

The boot-up mode activation signal FZYEN may be a signal which defines the activation of the boot-up mode.

In the fuse informations FZYDATA<0:7> and FZXDATA<0:12>, the fuse informations FZYDATA<0:7> may be failed column address informations. In addition, the fuse informations FZXDATA<0:12> may be failed row address informations.

Memory cells in which fails have occurred, or failed cells, may be detected in the course of testing the semiconductor apparatus 100. Column address informations and row address informations to access the failed cells may be stored in the fuse set array 101 as the fuse informations FZYDATA<0:7> and FZXDATA<0:12> through rupture operations.

The boot-up counter 102 may be configured to control the values of boot-up mode region select informations ATROWB<0:15> in response to the fuse read clock signal FZYCLK where the boot-up mode activation signal FZYEN is activated.

The core block 103 may include a plurality of memory blocks and a repair circuit 110, 200 and 210.

The plurality of memory blocks may include first to fourth banks BK0 to BK3.

While the first to fourth banks BK0 to BK3 are illustrated for the sake of convenience, it is to be noted that 4 or more banks may be actually included according to a memory capacity.

The repair circuit 110, 200 and 210 may include fuse set latch arrays (FL) 110, fuse information control units 200, and a repair processing unit 210.

One or more fuse set latch arrays 110 may be included in each of the first to fourth banks BK0 to BK3.

The fuse set latch arrays 110 as components that correspond to the fuse set array 101, may be configured to store the fuse informations FZYDATA<0:7> and FZXDATA<0:12> outputted by the fuse set array 101 in the boot-up mode.

Although detailed descriptions will be made with reference to FIG. 2, the fuse set latch arrays 110 may be configured to store the fuse informations FZYDATA<0:7> and FZXDATA<0:12> in target fuse latches selected among a plurality of fuse set latches in response to fuse latch select signals XMATYF_BK0L<0:39>, XMATYF_BK0R<0:39>, XMATYF_BK1L<0:39> and XMATYF_BK1R<0:39>.

Each of the fuse set latch arrays 110 may include a plurality of fuse set latches.

The fuse set latch arrays 110 play the same role as the buffer memories of a computer. More specifically, the fuse set latch arrays 110 are configured to allow the fuse informations FZYDATA<0:7> and FZXDATA<0:12> to be read within a shorter time than in the case of reading the fuse informations FZYDATA<0:7> and FZXDATA<0:12> from the fuse set array 101.

The fuse information control units 200 may be configured to select fuse latches among the fuse set latches of the fuse set latch arrays 110 in which the fuse informations FZYDATA<0:7> and FZXDATA<0:12> are to be stored, according to normal mode region select informations XMATDE<0:3>, XMATYF<0:4> and XMAT_EV and the boot-up mode region select informations ATROWB<0:15>. The fuse information control units 200 may be configured to generate the fuse latch select signals using boot-up source signals MATSEL_BU<0:5> generated by differently combining boot-up mode region selection informations ATROWB<0:15> according to a region determination signal SEGFZ.

Hereinbelow, fuse latches in which current fuse informations FZYDATA<0:7> and FZXDATA<0:12> are to be stored, among the fuse set latches of the fuse set latch arrays 110, will be referred to as target fuse latches.

The fuse information control units 200 may be configured to select target fuse latches according to the normal mode region select informations XMATDE<0:3>, XMATYF<0:4> and XMAT_EV in a normal mode.

Each of the first to fourth banks BK0 to BK3 may include a plurality of unit blocks, such as for example, 4 mats.

Each mat may include 5 unit blocks.

The 5 unit blocks may be divided into even blocks and odd blocks.

Among the normal mode region select informations XMATDE<0:3>, XMATYF<0:4> and XMAT_EV, the informations XMATDE<0:3> may be signals to designate fuse set latches corresponding to 4 mats. The informations XMATYF<0:4> may be signals to designate fuse set latches corresponding to 5 unit blocks of each mat. The information XMAT_EV may be a signal to designate one of the even blocks and the odd blocks of 5 unit blocks of each mat.

The fuse information control units 200 may be configured to select target fuse latches according to the boot-up mode region select informations ATROWB<0:15> in the boot-up mode.

The repair processing unit 210 may be configured to compare an address inputted from an exterior or an external address and the fuse informations FZYDATA<0:7> and FZXDATA<0:12> stored in the fuse set latch arrays 110. The repair processing unit 210 may also be configured to access a normal cell (a memory cell in which a fail has not occurred) or a redundant cell (a memory cell which replaces a failed cell) corresponding to the external address.

The repair processing unit 210 may be configured to access a normal cell corresponding to the external address when the external address is an address not included in the fuse informations FZYDATA<0:7> and FZXDATA<0:12>.

The repair processing unit 210 may be configured to access a redundant cell when the external address is an address included in the fuse informations FZYDATA<0:7> and FZXDATA<0:12>.

Referring to FIG. 1, each of the first to fourth banks BK0 to BK3 is divided into 2 regions (a left region and a right region for the sake of convenience in explanation). In addition, 1 fuse set latch array 110 is provided for each of the left region and the right region.

Therefore, 2 fuse set latch arrays 110 may be provided for each of the first to fourth banks BK0 to BK3.

Hereinbelow, the left regions of the first to fourth banks BK0 to BK3 may be denoted by reference symbols BK0L, BK1L, BK2L and BK3L. Further, the right regions of the first to fourth banks BK0 to BK3 may be denoted by reference symbols BK0R, BK1R, BK2R and BK3R.

In the semiconductor apparatus 100 described above, before performing the normal operation, an operation of storing the fuse informations FZYDATA<0:7> and FZXDATA<0:12> stored in the fuse set array 101, in the fuse set latch arrays 110, may be performed in advance in the boot-up mode.

In the boot-up mode, the fuse set array 101 provides the boot-up mode activation signal FZYEN and the fuse read clock signal FZYCLK to the boot-up counter 102. In addition, the fuse set array 101 provides the boot-up mode activation signal FZYEN and the fuse informations FZYDATA<0:7> and FZXDATA<0:12> to the fuse set latch arrays 110.

The fuse set array 101 sequentially selects its fuse sets according to the fuse read clock signal FZYCLK. Further, the fuse set array 101 outputs corresponding fuse informations FZYDATA<0:7> and FZXDATA<0:12>.

The boot-up counter 102 sequentially changes the values of the boot-up mode region select informations ATROWB<0:15> according to the fuse read clock signal FZYCLK such that target fuse latches corresponding to current fuse informations FZYDATA<0:7> and FZXDATA<0:12> are selected.

As the fuse information control units 200 sequentially select target fuse latches according to the boot-up mode region select informations ATROWB<0:15> in the boot-up mode, the fuse informations FZYDATA<0:7> and FZXDATA<0:12> may be precisely stored in target fuse latches.

Figure 2:
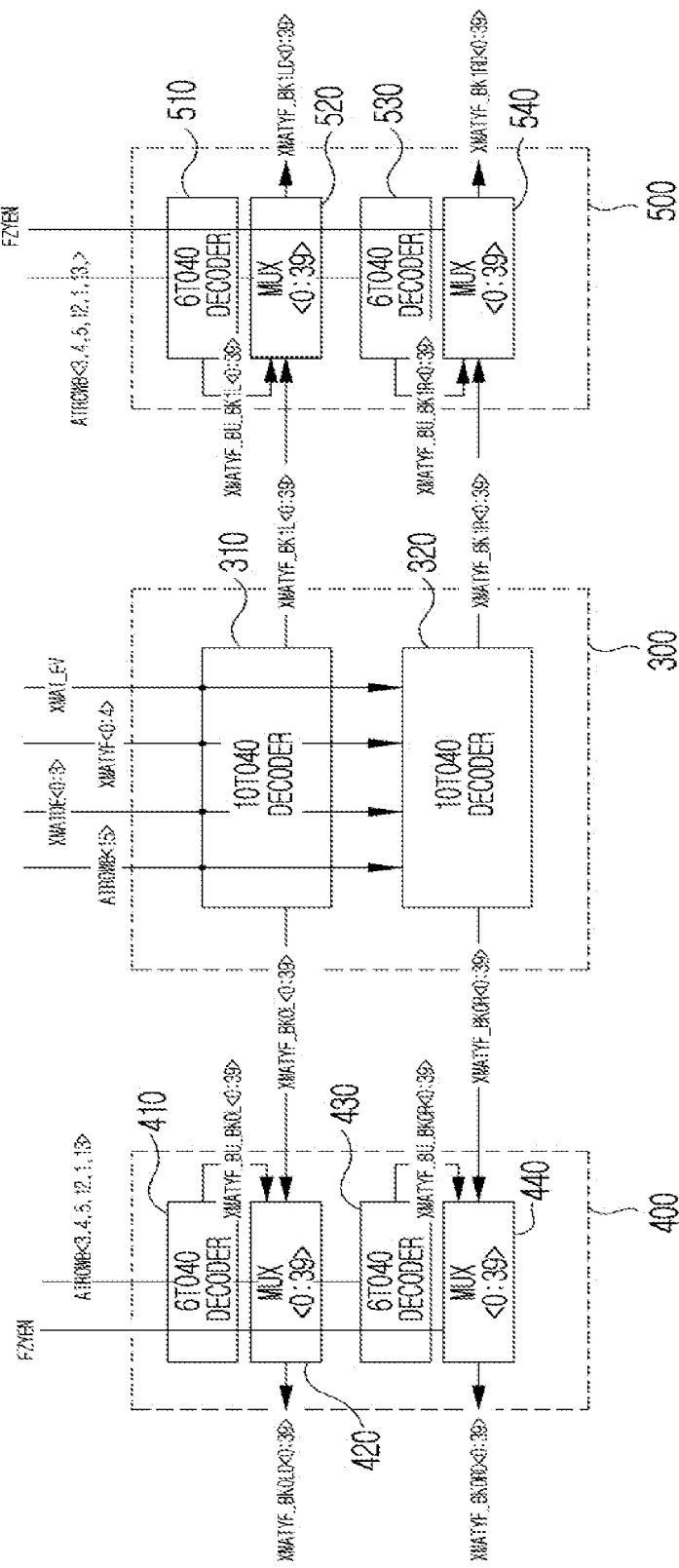
FIG. 2 is a diagram illustrating a representation of an example of a configuration of the fuse information control unit shown in FIG. 1.

Referring to FIG. 2, the fuse information control unit 200 may include a normal fuse information decoding section 300, a first boot-up fuse information decoding section 400, and a second boot-up fuse information decoding section 500.

The normal fuse information decoding section 300 may be configured to decode the normal mode region select informations XMATDE<0:3>, XMATYF<0:4> and XMAT_EV according to a specified bit ATROWB<15> among the boot-up mode region select informations ATROWB<0:15>. Further, the normal fuse information decoding section 300 may generate normal fuse latch select signals XMATYF_BK0L<0:39>, XMATYF_BK0R<0:39>, XMATYF_BK1L<0:39> and XMATYF_BK1R<0:39>.

Among the normal fuse latch select signals XMATYF_BK0L<0:39>, XMATYF_BK0R<0:39>, XMATYF_BK1L<0:39> and XMATYF_BK1R<0:39>, the normal fuse latch select signals XMATYF_BK0L<0:39> are signals which correspond to the left region of the first bank BK0. Further, the normal fuse latch select signals XMATYF_BK0R<0:39> are signals which correspond to the right region of the first bank BK0. In addition, the normal fuse latch select signals XMATYF_BK1L<0:39> are signals which correspond to the left region of the second bank BK1. Moreover, the normal fuse latch select signals XMATYF_BK1R<0:39> are signals which correspond to the right region of the second bank BK1.

The normal fuse information decoding section 300 may include a first decoder 310 and a second decoder 320.

The first decoder 310 and the second decoder 320 may share the normal mode region select informations XMATDE<0:3>, XMATYF<0:4> and XMAT_EV. Further, the first decoder 310 and the second decoder 320 may be configured in such a manner that any one of them is activated and performs a decoding operation according to the specified bit ATROWB<15>.

The first boot-up fuse information decoding section 400 may be configured to decode some bits ATROWB<3, 4, 5, 12, 1, 13> of the boot-up mode region select informations ATROWB<0:15>. The first boot-up fuse information decoding section 400 may also generate boot-up fuse latch select signals XMATYF_BU_BK0L<0:39> and XMATYF_BU_BK0R<0:39>. In addition, the first boot-up fuse information decoding section 400 may also select the normal fuse latch select signals XMATYF_BK0L<0:39> and XMATYF_BK0R<0:39> or the boot-up fuse latch select signals XMATYF_BU_BK0L<0:39> and XMATYF_BU_BK0R<0:39> according to the boot-up mode activation signal FZYEN and generate output signals XMATYF_BK0LD<0:39> and XMATYF_BK0RD<0:39>.

The first boot-up fuse information decoding section 400 may include a first decoder 410, a first multiplexer 420, a second decoder 430, and a second multiplexer 440.

The first decoder 410 may be configured to decode the some bits ATROWB<3, 4, 5, 12, 1, 13> of the boot-up mode region select informations ATROWB<0:15>. The first decoder 410 may also generate the boot-up fuse latch select signals XMATYF_BU_BK0L<0:39>.

The first multiplexer 420 may be configured to select the normal fuse latch select signals XMATYF_BK0L<0:39> or the boot-up fuse latch select signals XMATYF_BU_BK0L<0:39> according to the boot-up mode activation signal FZYEN. Further, the first multiplexer 420 may also generate the output signals XMATYF_BK0LD<0:39>.

The first multiplexer 420 may be configured to generate the output signals XMATYF_BK0LD<0:39> by selecting the boot-up fuse latch select signals XMATYF_BU_BK0L<0:39> when the boot-up mode activation signal FZYEN is activated.

The second decoder 430 may be configured to decode the some bits ATROWB<3, 4, 5, 12, 1, 13> of the boot-up mode region select informations ATROWB<0:15>. In addition, the second decoder 430 may also generate the boot-up fuse latch select signals XMATYF_BU_BK0R<0:39>.

The second multiplexer 440 may be configured to select the normal fuse latch select signals XMATYF_BK0R<0:39> or the boot-up fuse latch select signals XMATYF_BU_BK0R<0:39> according to the boot-up mode activation signal FZYEN. The second multiplexer 440 may also generate the output signals XMATYF_BK0RD<0:39>.

The second multiplexer 440 may be configured to generate the output signals XMATYF_BK0RD<0:39> by selecting the boot-up fuse latch select signals XMATYF_BU_BK0R<0:39> when the boot-up mode activation signal FZYEN is activated.

The second boot-up fuse information decoding section 500 may be configured to decode some bits ATROWB<3, 4, 5, 12, 1, 13> of the boot-up mode region select informations ATROWB<0:15>. The second boot-up fuse information decoding section 500 may also generate boot-up fuse latch select signals XMATYF_BU_BK1L<0:39> and XMATYF_BU_BK1R<0:39>. Further, the second boot-up fuse information decoding section 500 may select the normal fuse latch select signals XMATYF_BK1L<0:39> and XMATYF_BK1R<0:39> or the boot-up fuse latch select signals XMATYF_BU_BK1L<0:39> and XMATYF_BU_BK1R<0:39> according to the boot-up mode activation signal FZYEN and generate output signals XMATYF_BK1LD<0:39> and XMATYF_BK1RD<0:39>.

The second boot-up fuse information decoding section 500 may include a first decoder 510, a first multiplexer 520, a second decoder 530, and a second multiplexer 540.

The first decoder 510 may be configured to decode the some bits ATROWB<3, 4, 5, 12, 1, 13> of the boot-up mode region select informations ATROWB<0:15>. The first decoder 510 may also generate the boot-up fuse latch select signals XMATYF_BU_BK1L<0:39>.

The first multiplexer 520 may be configured to select the normal fuse latch select signals XMATYF_BK1L<0:39> or the boot-up fuse latch select signals XMATYF_BU_BK1L<0:39> according to the boot-up mode activation signal FZYEN. The first multiplexer 520 may also generate the output signals XMATYF_BK1LD<0:39>.

The first multiplexer 520 may be configured to generate the output signals XMATYF_BK1LD<0:39> by selecting the boot-up fuse latch select signals XMATYF_BU_BK1L<0:39> when the boot-up mode activation signal FZYEN is activated.

The second decoder 530 may be configured to decode the some bits ATROWB<3, 4, 5, 12, 1, 13> of the boot-up mode region select informations ATROWB<0:15>. The second decoder 530 may also generate the boot-up fuse latch select signals XMATYF_BU_BK1R<0:39>.

The second multiplexer 540 may be configured to select the normal fuse latch select signals XMATYF_BK1R<0:39> or the boot-up fuse latch select signals XMATYF_BU_BK1R<0:39> according to the boot-up mode activation signal FZYEN. The second multiplexer 540 may also generate the output signals XMATYF_BK1RD<0:39>.

The second multiplexer 540 may be configured to generate the output signals XMATYF_BK1RD<0:39> by selecting the boot-up fuse latch select signals XMATYF_BU_BK1R<0:39> when the boot-up mode activation signal FZYEN is activated.

Figure 3:
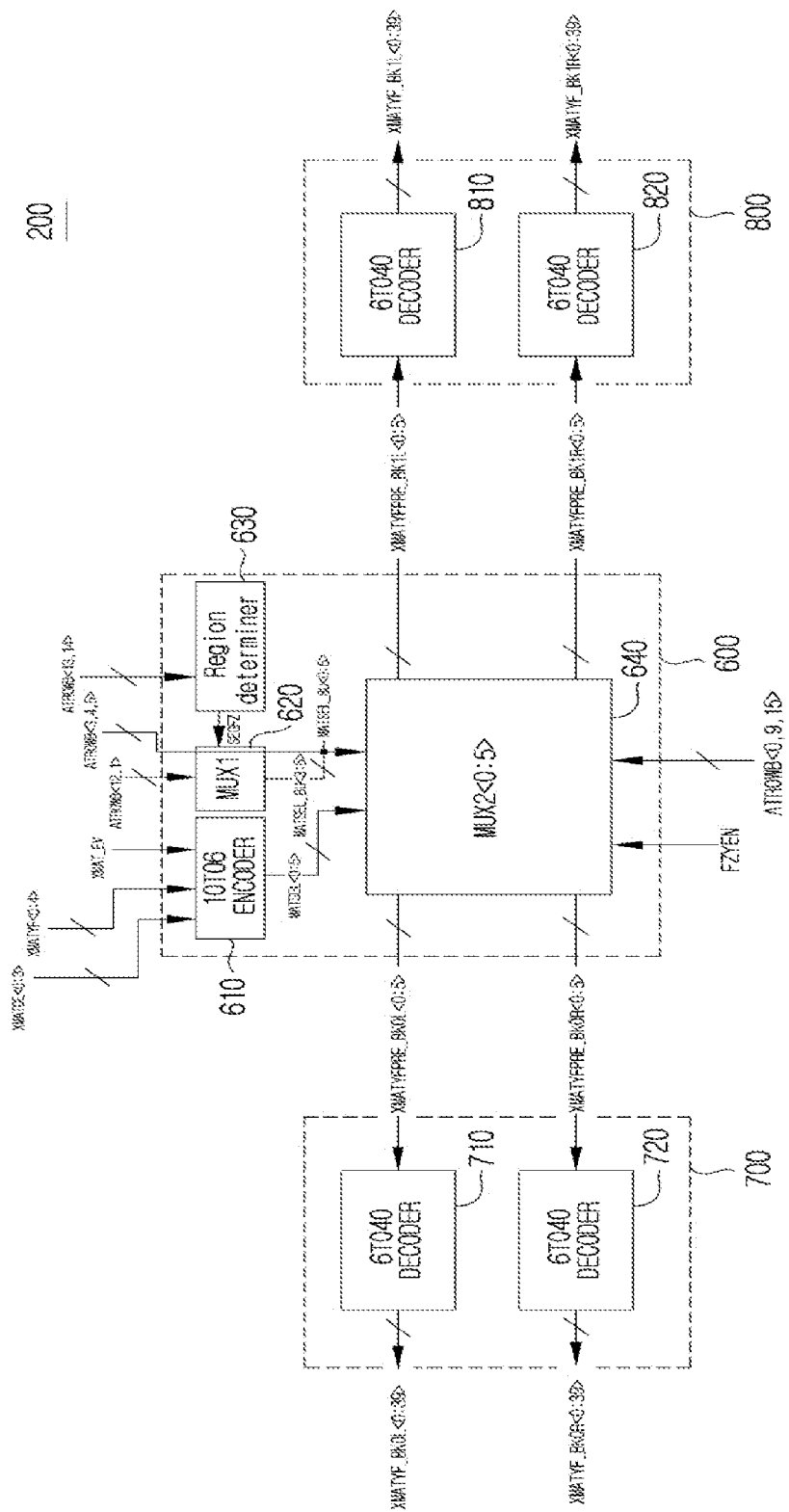
FIG. 3 is a diagram illustrating a representation of an example of another configuration of the fuse information control unit shown in FIG. 1.

Referring to FIG. 3, a configuration of the fuse information control unit 200 may include a control section 600, and decoding sections 700 and 800.

The control section 600 may be configured to select ones of normal source signals MATSEL<0:5> generated by encoding the normal mode region select informations XMATDE<0:3>, XMATYF<0:4> and XMAT_EV, and boot-up source signals MATSEL_BU<0:5> generated by differently combining the boot-up mode region select informations ATROWB<0:15> according to a region determination signal SEGFZ, according to the boot-up mode activation signal FZYEN. The control section 600 may also generate fuse latch select pre-signals XMATYFPRE_BKOL<0:5>, XMATYFPRE_BKOR<0:5>, XMATYFPRE_BK1L<0:5> and XMATYFPRE_BK1R<0: 5>.

The control section 600 may include an encoder 610, a first multiplexer 620, a region determiner 630, and a second multiplexer 640.

The encoder 610 may be configured to encode the normal mode region select informations XMATDE<0:3>, XMATYF<0:4> and XMAT_EV. The encoder 610 may also generate the normal source signals MATSEL<0:5>.

The first multiplexer 620 may be configured to generate the boot-up source signals MATSEL_BU<0:5> by using the region determination signal SEGFZ and some signal bits ATROWB<1, 3, 4, 5, 12> of the boot-up mode region select informations ATROWB<0:15>.

The first multiplexer 620 may generate some signal bits MATSEL_BU<3:5> of the boot-up source signals MATSEL_BU<0:5> by combining some signal bits ATROWB<1, 12> of the boot-up mode region select informations ATROWB<0:15> according to the region determination signal SEGFZ.

Other signal bits ATROWB<3:5> of the boot-up mode region select informations ATROWB<0:15> may be used as the other signal bits MATSEL_BU<0:2> of the boot-up source signals MATSEL_BU<0:5>.

The region determiner 630 may be configured to generate the region determination signal SEGFZ according to some signal bits ATROWB<13, 14> of the boot-up mode region select informations ATROWB<0:15>.

The fuse set array 101 may have a structure similar to the bank BK of the core block 103.

The fuse set array 101 may be divided into the units of mats. In addition, spare column lines (SYi) may be asymmetrically disposed to increase areal and wiring efficiencies.

For example, the spare column lines (SYi) may be disposed by being divided into a first region MAT0-31 and a second region MAT32-39.

The boot-up mode region select informations ATROWB<0:15> used to select the first region MAT0-31 and the second region MAT32-39 may be different in the normal mode and the boot-up mode.

Accordingly, in an embodiment, whether a currently selected region is the first region MAT0-31 or the second region MAT32-39 may be determined according to the region determination signal SEGFZ generated by using the signal bits ATROWB<13, 14> related with the determination of the first region MAT0-31 and the second region MAT32-39.

The second multiplexer 640 may be configured to generate the fuse latch select pre-signals XMATYFPRE_BKOL<0: 5>, XMATYFPRE_BKOR<0:5>, XMATYFPRE_BK1L<0: 5> and XMATYFPRE_BK1R<0:5> in response to the normal source signals MATSEL<0:5>, the boot-up source signals MATSEL_BU<0:5>, the boot-up mode activation signal FZYEN and some signal bits ATROWB<0, 9, 15> of the boot-up mode region select informations ATROWB<0: 15>.

The second multiplexer 640 may be configured to select ones of the normal source signals MATSEL<0:5> and the boot-up source signals MATSEL_BU<0:5> according to the boot-up mode activation signal FZYEN.

The second multiplexer 640 may select the boot-up source signals MATSEL_BU<0:5> when the boot-up mode activation signal FZYEN is activated. The second multiplexer 640 may select the normal source signals MATSEL<0:5> when the boot-up mode activation signal FZYEN is deactivated.

The second multiplexer 640 may select memory blocks BK0L, BK0R, BK1L and BK1R to which the normal source signals MATSEL<0:5> or the boot-up source signals MATSEL_BU<0:5> are to be provided according to the some signal bits ATROWB<0, 9, 15> of the boot-up mode region select informations ATROWB<0:15>.

More specifically, the second multiplexer 640 may selectively activate one set of the fuse latch select pre-signals XMATYFPRE_BKOL<0:5>, XMATYFPRE_BKOR<0:5>, XMATYFPRE_BK1L<0:5> and XMATYFPRE_BK1R<0: 5>, according to the some signal bits ATROWB<0, 9, 15> of the boot-up mode region select informations ATROWB<0: 15>.

The decoding sections 700 and 800 may be configured to decode the fuse latch select pre-signals XMATYFPRE_BKOL<0:5>, XMATYFPRE_BKOR<0:5>, XMATYFPRE_BK1L<0:5> and XMATYFPRE_BK1R<0: 5>. The decoding sections 700 and 800 may also generate fuse latch select signals XMATYF_BKOL<0:39>, XMATYF_BKOR<0:39>, XMATYF_BK1L<0:39> and XMATYF_BK1R<0:39>.

Target fuse latches may be selected according to the fuse latch select signals XMATYF_BKOL<0:39>, XMATYF_BKOR<0:39>, XMATYF_BK1L<0:39> and XMATYF_BK1R<0:39>.

The decoding sections 700 and 800 may include a first decoding section 700 and a second decoding section 800.

The first decoding section 700 may include a first decoder 710 and a second decoder 720.

The first decoder 710 may be configured to decode the fuse latch select pre-signals XMATYFPRE_BKOL<0:5>. The first decoder 710 may also generate the fuse latch select signals XMATYF_BKOL<0:39>.

The second decoder 720 may be configured to decode the fuse latch select pre-signals XMATYFPRE_BKOR<0:5>. The second decoder 720 may also generate the fuse latch select signals XMATYF_BKOR<0:39>.

The second decoding section 800 may include a first decoder 810 and a second decoder 820.

The first decoder 810 may be configured to decode the fuse latch select pre-signals XMATYFPRE_BK1L<0:5>. The first decoder 810 may also generate the fuse latch select signals XMATYF_BK1L<0:39>.

The second decoder 820 may be configured to decode the fuse latch select pre-signals XMATYFPRE_BK1R<0:5>. The second decoder 820 may also generate the fuse latch select signals XMATYF_BK1R<0:39>.

Figure 4:
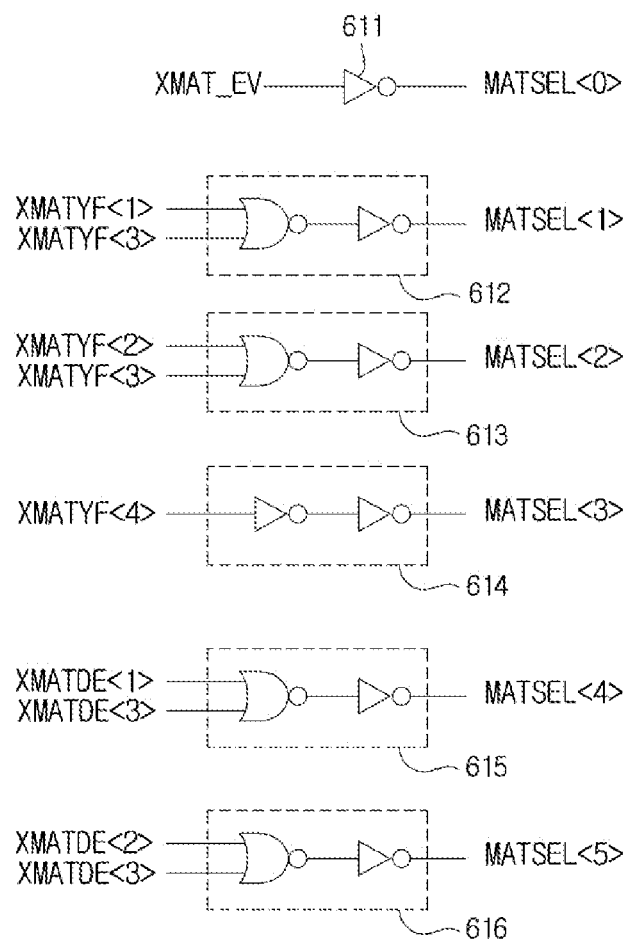
FIG. 4 is a diagram illustrating a representation of an example of the configuration of the encoder shown in FIG. 3.

Referring to FIG. 4, the encoder 610 may include first to sixth logic elements 611 to 616.

The first logic element 611 may be configured to invert the normal mode region select information XMAT_EV. The first logic element 611 may generate the normal source signal MATSEL<0>.

The second logic element 612 may be configured to OR or perform an OR logic function on the normal mode region select informations XMATYF<1> and XMATYF<3>. The second logic element 612 may generate the normal source signal MATSEL<1>.

The third logic element 613 may be configured to OR or perform an OR logic function on the normal mode region select informations XMATYF<2> and XMATYF<3>. In addition, the third logic element 613 may generate the normal source signal MATSEL<2>.

The fourth logic element 614 may be configured to buffer normal mode region select information XMATYF<4> and output the normal source signal MATSEL<3>.

The fifth logic element 615 may be configured to OR or perform an OR logic function on the normal mode region select informations XMATDE<1> and XMATDE<3>. Further, the fifth logic element 615 may generate the normal source signal MATSEL<4>.

The sixth logic element 616 may be configured to OR or perform an OR logic function on the normal mode region select informations XMATDE<2> and XMATDE<3>. In addition, the sixth logic element 616 may generate the normal source signal MATSEL<5>.

The design principle of the first multiplexer 620 of FIG. 3 will be described below with reference to the top table of FIG. 5.

Figure 5:
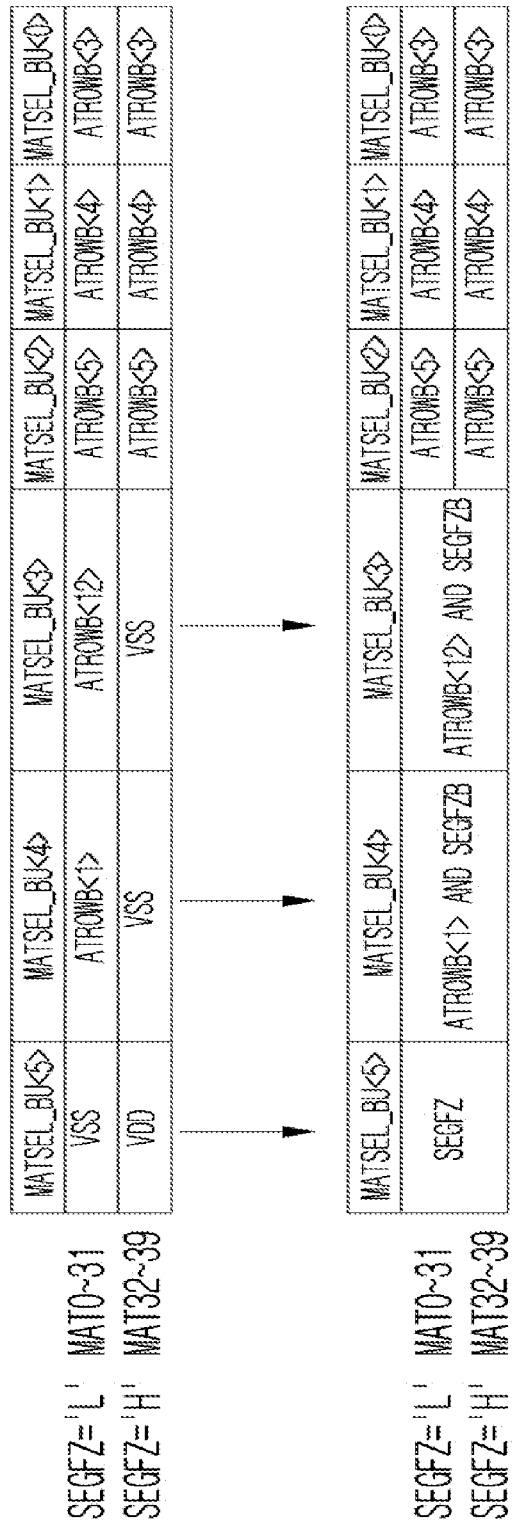
FIG. 5 is a representation of an example of a logic table to assist in the explanation of the design principle of the first multiplexer shown in FIG. 3.

Referring to the top table of FIG. 5, the relationship between the boot-up source signals MATSEL_BU<0:5> and the region determination signal SEGFZ to determine a region to be selected between the first region MAT0-31 and the second region MAT32-39 of the fuse set array 101 may be seen.

Where both the signal bits ATROWB<13, 14> are logic lows, it is meant that the second region MAT32-39 is selected, and the region determination signal SEGFZ may have a logic high value.

When even any one of the signal bits ATROWB<13, 14> is a logic high, it is meant that the first region MAT0-31 is selected and the region determination signal SEGFZ may have a logic low value.

As shown in FIG. 5, the signal bits MATSEL_BU<0:2> of the boot-up source signals MATSEL_BU<0:5> may be determined according to the signal bits ATROWB<3:5>.

The signal bits MATSEL_BU<3:5> may be respectively the signal bit ATROWB<12>, the signal bit ATROWB<1> and a logic low VSS where the region determination signal SEGFZ is a logic low.

The signal bits MATSEL_BU<3:5> may be fixed to the logic low VSS, the logic low VSS and a logic high VDD where the region determination signal SEGFZ is a logic high.

In an embodiment, the values of the signal bits MATSEL_BU<3:5> may be generated as in the bottom table of FIG. 5 by using the combination of the region determination signal SEGFZ and the signal bits ATROWB<1, 12>.

Referring to the bottom table of FIG. 5, the region determination signal SEGFZ is used as the signal bit MATSEL_BU<5>. Further, a result of ANDing or an AND logic function on a signal SEGFZB and the signal bit ATROWB<1> is used as the signal bit MATSEL_BU<4>. In addition, a result of ANDing or an AND logic function on the signal SEGFZB and the signal bit ATROWB<12> is used as the signal bit MATSEL_BU<3>.

The signal SEGFZB is an inverted signal of the region determination signal SEGFZ.

Figure 6:
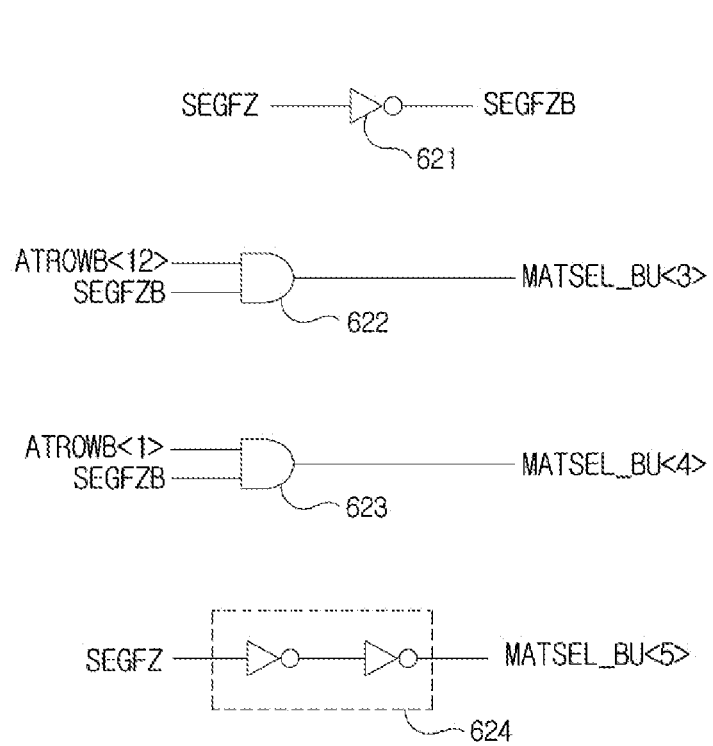
FIG. 6 is a diagram illustrating a representation of an example of the configuration of the first multiplexer according to FIG. 5.

Referring to FIG. 6, a diagram illustrating a representation of an example of the configuration of the first multiplexer 620 which results from realizing the bottom table of FIG. 5 in logic patterns is described.

In FIG. 6, the first multiplexer 620 may include first to fourth logic elements 621 to 624.

The first logic element 621 may be configured to invert the region determination signal SEGFZ and generate the signal SEGFZB.

The second logic element 622 may be configured to AND or perform an AND logic function on the signal bit ATROWB<12> and the signal SEGFZB.

The third logic element 623 may be configured to AND or perform an AND logic function on the signal bit ATROWB<1> and the signal SEGFZB.

The fourth logic element 624 may buffer the region determination signal SEGFZ. The fourth logic element 624 may also output the signal bit MATSEL_BU<5>.

Figure 7:
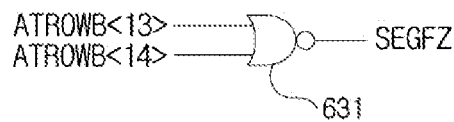
FIG. 7 is a diagram illustrating a representation of an example of the configuration of the region determiner shown in FIG. 3.

As shown in FIG. 7, the region determiner 630 may include a logic element 631.

The logic element 631 may be configured to NOR or perform a NOR logic function on the signal bit ATROWB<13> and the signal bit ATROWB<14>. The logic element 631 may also generate the region determination signal SEGFZ.

Figure 8:
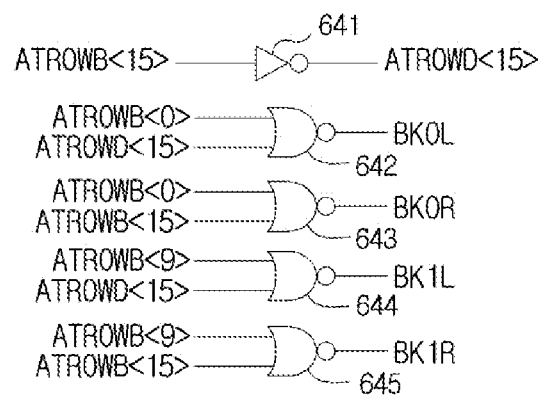
FIG. 8 is a diagram illustrating a representation of an example of the configuration of the second multiplexer shown in FIG. 3.
Figure 8:
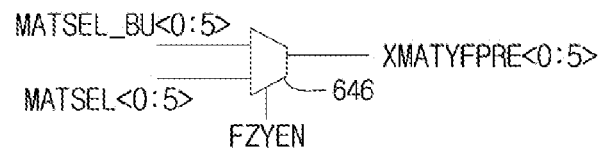
Figure 8:
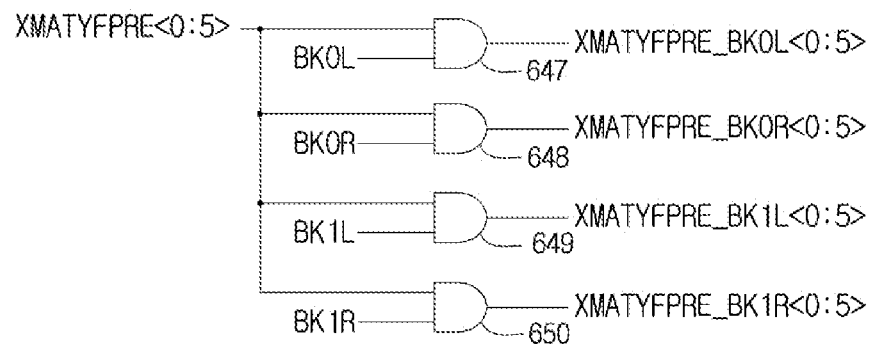

Referring to FIG. 8, the second multiplexer 640 may include first to tenth logic elements 641 to 650.

The first logic element 641 may be configured to invert the signal bit ATROWB<15> and generate a signal ATROWD<15>.

The second logic element 642 may be configured to NOR or perform a NOR logic function on the signal bit ATROWB<0> and the signal ATROWD<15>. In addition, the second logic element 642 may generate a signal BK0L.

The third logic element 643 may be configured to NOR or perform a NOR logic function on the signal bit ATROWB<0> and the signal bit ATROWB<15>. The third logic element 643 may also generate a signal BK0R.

The fourth logic element 644 may be configured to NOR or perform a NOR logic function on the signal bit ATROWB<9> and the signal ATROWD<15>. The fourth logic element 644 may also generate a signal BK1L.

The fifth logic element 645 may be configured to NOR or perform a NOR logic function on the signal bit ATROWB<9> and the signal bit ATROWB<15>. The fifth logic element 645 may also generate a signal BK1R.

The signals BK0L, BK0R, BK1L and BK1R may be used as bank determination signals to determine the left regions and the right regions of the two banks BK0 and BK1.

In particular, the signal BK0L may be used as a signal to determine the left region of the bank BK0. Further, the signal BK0R may be used as a signal to determine the right region of the bank BK0. Moreover, the signal BK1L may be used as a signal to determine the left region of the bank BK1. In addition, the signal BK1R may be used as a signal to determine the right region of the bank BK1.

The sixth logic element 646 may be configured to select the boot-up source signals MATSEL_BU<0:5> or the normal source signals MATSEL<0:5> according to the boot-up mode activation signal FZYEN. In addition, the sixth logic element 646 may generate output signals XMATYFPRE<0:5>.

The sixth logic element 646 may generate the output signals XMATYFPRE<0:5> by selecting the boot-up source signals MATSEL_BU<0:5> when the boot-up mode activation signal FZYEN has an activation level (for example, a logic high).

The sixth logic element 646 may generate the output signals XMATYFPRE<0:5> by selecting the normal source signals MATSEL<0:5> when the boot-up mode activation signal FZYEN has a deactivation level (for example, a logic low).

The seventh to tenth logic elements 647 to 650 may be configured to AND or perform an AND logic function on the respective bank determination signals BK0L, BK0R, BK1L and BK1R and the output signals XMATYFPRE<0:5> of the sixth logic element 646. The seventh to tenth logic elements 647 to 650 may generate the fuse latch select pre-signals XMATYFPRE_BKOL<0:5>, XMATYFPRE_BKOR<0:5>, XMATYFPRE_BK1L<0:5> and XMATYFPRE_BK1R<0:5>.

Operations of the fuse information control unit 200 of FIG. 3 configured as mentioned above will be described below.

If an entry is made to the boot-up mode, the region determiner 630 determines which of the first region MAT0-31 and the second region MAT32-39 of the fuse set array 101 is selected, according to the some signal bits ATROWB<13:14> of the boot-up mode region select informations ATROWB<0:15>. In addition, the region determiner 630 generates the region determination signal SEGFZ.

The first multiplexer 620 generates the boot-up source signals MATSEL_BU<0:5> which are combined to have different values according to the level (the logic high/the logic low) of the region determination signal SEGFZ.

Since the boot-up mode activation signal FZYEN is the logic high in the boot-up mode, the second multiplexer 640 selects the boot-up source signals MATSEL_BU<0:5>.

The second multiplexer 640 activates one signal set among the fuse latch select pre-signals XMATYFPRE_BKOL<0:5>, XMATYFPRE_BKOR<0:5>, XMATYFPRE_BK1L<0:5> and XMATYFPRE_BK1R<0:5> by using the boot-up source signals MATSEL_BU<0:5> and the some signal bits ATROWB<0, 9, 15> of the boot-up mode region select informations ATROWB<0:15>.

The decoding sections 700 and 800 decode the one signal set activated among the fuse latch select pre-signals XMATYFPRE_BKOL<0:5>, XMATYFPRE_BKOR<0:5>, XMATYFPRE_BK1L<0:5> and XMATYFPRE_BK1R<0:5>. In addition, the decoding sections 700 and 800 and activate one signal set among the fuse latch select signals XMATYF_BKOL<0:39>, XMATYF_BKOR<0:39>, XMATYF_BK1L<0:39> and XMATYF_BK1R<0:39>.

Thereafter, the fuse informations FZYDATA<0:7> and FZXDATA<0:12> provided from the fuse set array 101 may be stored in the target fuse latches selected according to the fuse latch select signals XMATYF_BKOL<0:39>, XMATYF_BKOR<0:39>, XMATYF_BK1L<0:39> and XMATYF_BK1R<0:39>.

In the normal mode, the encoder 610 encodes the normal mode region select informations XMATDE<0:3>, XMATYF<0:4> and XMAT_EV. In addition, the encoder 610 generates the normal source signals MATSEL<0:5>.

Since the boot-up mode activation signal FZYEN is the logic low in the normal mode, the second multiplexer 640 selects the normal source signals MATSEL<0:5>.

The second multiplexer 640 activates one signal set among the fuse latch select pre-signals XMATYFPRE_BKOL<0:5>, XMATYFPRE_BKOR<0:5>, XMATYFPRE_BK1L<0:5> and XMATYFPRE_BK1R<0:5> by using the normal source signals MATSEL<0:5> and the some signal bits ATROWB<0, 9, 15> of the boot-up mode region select informations ATROWB<0:15>.

The decoding sections 700 and 800 decode the one signal set activated among the fuse latch select pre-signals XMATYFPRE_BKOL<0:5>, XMATYFPRE_BKOR<0:5>, XMATYFPRE_BK1L<0:5> and XMATYFPRE_BK1R<0:5>. Further, the decoding sections 700 and 800 activate one signal set among the fuse latch select signals XMATYF_BKOL<0:39>, XMATYF_BKOR<0:39>, XMATYF_BK1L<0:39> and XMATYF_BK1R<0:39>.

Thereafter, the fuse informations FZYDATA<0:7> and FZXDATA<0:12> stored in the target fuse latches selected according to the fuse latch select signals XMATYF_BKOL<0:39>, XMATYF_BKOR<0:39>, XMATYF_BK1L<0:39> and XMATYF_BK1R<0:39> are provided to the repair processing unit 210. Further, the repair processing unit 210 may perform a repair operation.

As can be readily seen from the above descriptions, in the fuse information control unit 200 of FIG. 3, the control section 600 determines whether it is the normal mode or the boot-up mode. In addition, the control section 600 further determines a region in the boot-up mode such that only minimum informations for allowing the fuse set latch array 110 to determine a region may be transmitted to the decoding sections 700 and 800. In addition, the decoding sections 700 and 800 may decode the informations and generate the final fuse latch select signals XMATYF_BKOL<0:39>, XMATYF_BKOR<0:39>, XMATYF_BK1L<0:39> and XMATYF_BK1R<0:39>, whereby a circuit area and wiring may be minimized.

Figure 9:
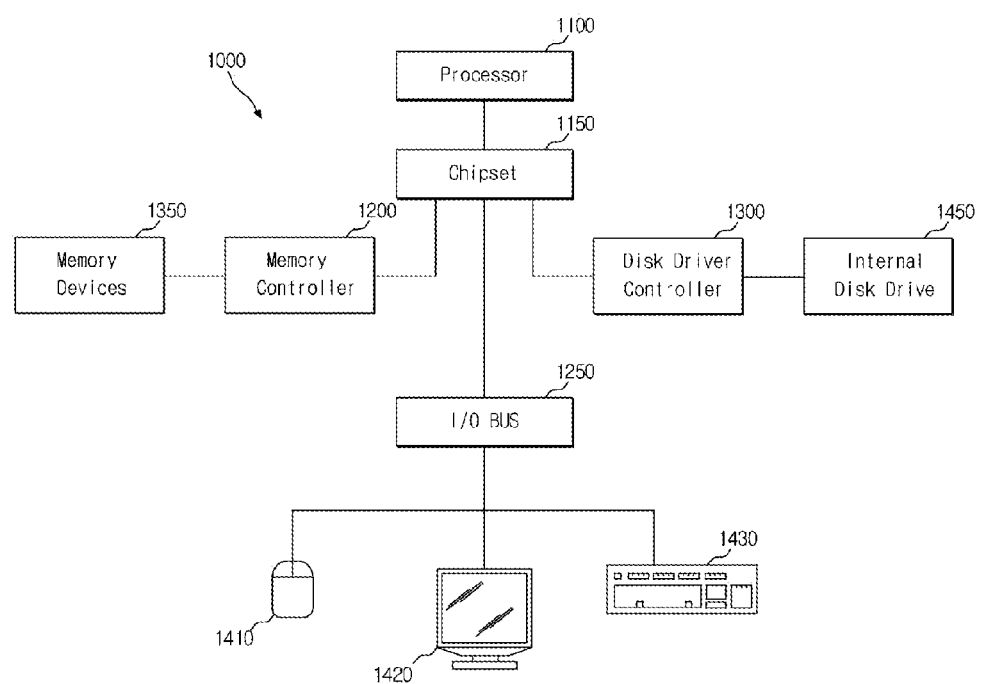
FIG. 9 illustrates a block diagram of a system employing a memory controller circuit in accordance with an embodiment of the invention.

Referring to FIG. 9, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard, 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While various embodiments have been described above, it will be understood to those skilled in the art that the embodiments described are by way of example only. Accordingly, the repair circuit and the semiconductor apparatus using the same described should not be limited based on the described embodiments.

What is claimed is:

1. A repair circuit comprising:
   a fuse set latch array including a plurality of fuse set latches, and configured to store fuse informations in target fuse latches selected among the plurality of fuse set latches in response to fuse latch select signals;
   a fuse information control unit configured to generate the fuse latch select signals using boot-up source signals generated by differently combining boot-up mode region select informations according to a region determination signal; and
   a repair processing unit configured to compare an address inputted from an exterior and the fuse informations, and access a normal memory cell corresponding to the external address or a redundant memory cell.

2. The repair circuit according to claim 1, further comprising:
   a fuse set array configured to output the fuse informations in a boot-up mode.

3. The repair circuit according to claim 2,
   wherein storage regions of the fuse set array are divided into a first region and a second region, and
   wherein the region determination signal is a signal which defines whether a region from which the fuse informations are to be outputted is the first region or the second region.

4. The repair circuit according to claim 2, wherein the fuse set array is configured to generate a fuse read clock signal in the boot-up mode.

5. The repair circuit according to claim 4, further comprising:
   a boot-up counter configured to change values of the boot-up mode region select informations according to the fuse read clock signal.

6. The repair circuit according to claim 1, wherein the fuse information control unit is configured to select ones of normal source signals generated by encoding normal mode region select informations and the boot-up source signals according to a boot-up mode activation signal, and generate the fuse latch select signals.

7. The repair circuit according to claim 6, wherein the fuse information control unit comprises:
   a control section configured to select ones of the normal source signals and the boot-up source signals according to the boot-up mode activation signal, and generate fuse latch select pre-signals; and
   a decoding section configured to decode the fuse latch select pre-signals and generate the fuse latch select signals.

8. The repair circuit according to claim 7, wherein the control section comprises:
   an encoder configured to encode the normal mode region select informations and generate the normal source signals;
   a first multiplexer configured to generate the boot-up source signals by using the region determination signal and some signal bits of the boot-up mode region select informations;
   a region determiner configured to generate the region determination signal according to some signal bits of the boot-up mode region select informations; and
   a second multiplexer configured to generate the fuse latch select pre-signals according to the normal source signals, the boot-up source signals, the boot-up mode activation signal, and some signal bits of the boot-up mode region select informations.

9. The repair circuit according to claim 8, wherein the first multiplexer is configured to generate some signal bits of the boot-up source signals by combining some signal bits of the boot-up mode region select informations according to the region determination signal.

10. A semiconductor apparatus comprising:
    a fuse set array configured to output fuse informations in a boot-up mode;
    a plurality of memory blocks each including a fuse set latch array configured to store the fuse informations in response to fuse latch select signals; and
    a repair circuit configured to generate the fuse latch select signals by using boot-up source signals generated by differently combining boot-up mode region select informations according to a region determination signal, compare addresses inputted from an exterior and the fuse informations, and access normal memory cells of the plurality of memory blocks corresponding to the external addresses or redundant memory cells.

11. The semiconductor apparatus according to claim 10,
    wherein storage regions of the fuse set array are divided into a first region and a second region, and
    wherein the region determination signal defines whether a region from which the fuse informations are to be outputted is included in the first region or the second region.

12. The semiconductor apparatus according to claim 10,
    wherein the fuse set array is configured to output a fuse read clock signal in the boot-up mode.

13. The semiconductor apparatus according to claim 12, further comprising:
    a boot-up counter configured to change values of the boot-up mode region select informations according to the fuse read clock signal.

14. The semiconductor apparatus according to claim 10,
    wherein the repair circuit is configured to select ones of normal source signals generated by encoding normal mode region select informations and the boot-up source signals according to a boot-up mode activation signal, and generate the fuse latch select signals.

15. The semiconductor apparatus according to claim 14,
    wherein the repair circuit comprises:
    a control section configured to select ones of the normal source signals and the boot-up source signals according to the boot-up mode activation signal, and generate fuse latch select pre-signals;
    a decoding section configured to decode the fuse latch select pre-signals, and generate the fuse latch select signals; and
    a repair processing unit configured to compare the addresses inputted from the exterior and the fuse informations, and access the normal memory cells corresponding to the external addresses or the redundant memory cells.

16. The semiconductor apparatus according to claim 15, wherein the control section comprises:
    an encoder configured to encode the normal mode region select informations and generate the normal source signals;
    a first multiplexer configured to generate the boot-up source signals by using the region determination signal and some signal bits of the boot-up mode region select informations;
    a region determiner configured to generate the region determination signal according to some signal bits of the boot-up mode region select informations; and
    a second multiplexer configured to generate the fuse latch select pre-signals according to the normal source signals, the boot-up source signals, the boot-up mode activation signal, and some signal bits of the boot-up mode region select informations.

17. The semiconductor apparatus according to claim 16, wherein the first multiplexer is configured to generate some signal bits of the boot-up source signals by combining some signal bits of the boot-up mode region select informations according to the region determination signal.

18. A repair circuit comprising:
    fuse set latch arrays configured to store fuse informations outputted by a fuse set array in a boot-up mode;
    fuse information control units configured to select fuse latches among the fuse set latch arrays wherein fuse informations are stored according to normal mode region select informations and boot-up mode region selection informations; and a repair processing unit configured to compare an external address and the fuse informations and access a normal cell or a redundant cell.

19. The repair circuit according to claim 18, wherein the repair processing unit is configured to access the normal cell when the external address is not included in the fuse informations.

20. The repair circuit according to claim 18, wherein the repair processing unit is configured to access the redundant cell when the external address is included in the fuse informations.

* * * * *